Oct. 3, 1961 E. F. MacNICHOL, JR 3,003,113

LOW LEVEL DIFFERENTIAL AMPLIFIER

Filed July 28, 1958

INVENTOR

Edward F. MacNichol, Jr.

BY Walter G. Finch

ATTORNEY 3,003,113

LOW LEVEL DIFFERENTIAL AMPLIFIER

Edward F. MacNichol, Jr., Belfast Road, Sparks, Md.

Filed July 28, 1958, Ser. No. 751,560
4 Claims. (Cl. 330—69)

This invention relates generally to electric amplifier, and more particularly it pertains to low level direct current differential amplifiers.

In physiological work and that relating to strain gauges, thermocouples, resistance thermometers and like transducers, it is frequently desirable to have a stable and reliable amplifier that can be connected between an input device and the oscilloscope or other recording instrument. Such application requires the detection of signals of less than 50 microvolts in many cases and of frequency response extending from D.C. to well above audio frequency. Furthermore, to be useful, the amplifier should have moderately high input impedance, and should be capable of minimizing the undesirable effects of interfering signals, such as stray pick-up, noise, and so forth which arise in working with exposed probes.

Available amplifiers to accomplish this are expensive and quite bulky. Cumbersome regulated power supplies are required and elaborate filtering schemes are included to prevent injection of line noise voltages. The best amplifier circuits for low level work use a balanced system which has a common mode signal rejection. An interfering signal developed with respect to ground and common to both non-grounded input terminals is passed unaltered through the amplifier while any differential signal which is impressed between the ungrounded terminals is desirably amplified.

The problems of interstage coupling and provision of a zero output resting level are quite difficult in D.C. amplifiers. Conventional amplifiers use voltage dropping networks, floating batteries, neon lamps, and avalanche diodes to accomplish the various voltage levels required. This too adds to the complexity.

It is a principal object of the present invention to provide an economical, calibrated low level D.C. differential amplifier having an improved band width and impedance characteristics.

It is a further object of this invention to provide a multistage D.C. amplifier having a single supply voltage and zero resting level output.

Another object of this invention is to provide a reliable decade gain control having balance checking features and noise, drift, and overload minimizing characteristics in a transistorized differential amplifier.

Still another object of the invention is to provide a stabilized differential amplifier having balance and D.C. level trimming adjustments with no effect on a predetermined amount of inverse feedback. The gain is stabilized within 5% by the inverse feedback network so that no gain trimming adjustments are necessary.

Further objects and advantages of this invention will become more apparent and understood from the accompanying specification and drawings in which.

The amplifier to be described is the final of several preliminary models. It will be noted that the resulting amplifier is of a transistorized balance or differential type and is in two sections, each having two cascaded common emitter stages and a common collector stage. The second stage is of complementary symmetry and cooperates with the first and last stage to accomplish direct metallic interstage coupling and a non-freqency-selective inverse feedback loop. At the same time, the last stage is brought to a zero resting level suitable for direct coupling output by itself or interstage to another amplifier section as shown.

Figures 1, 3:
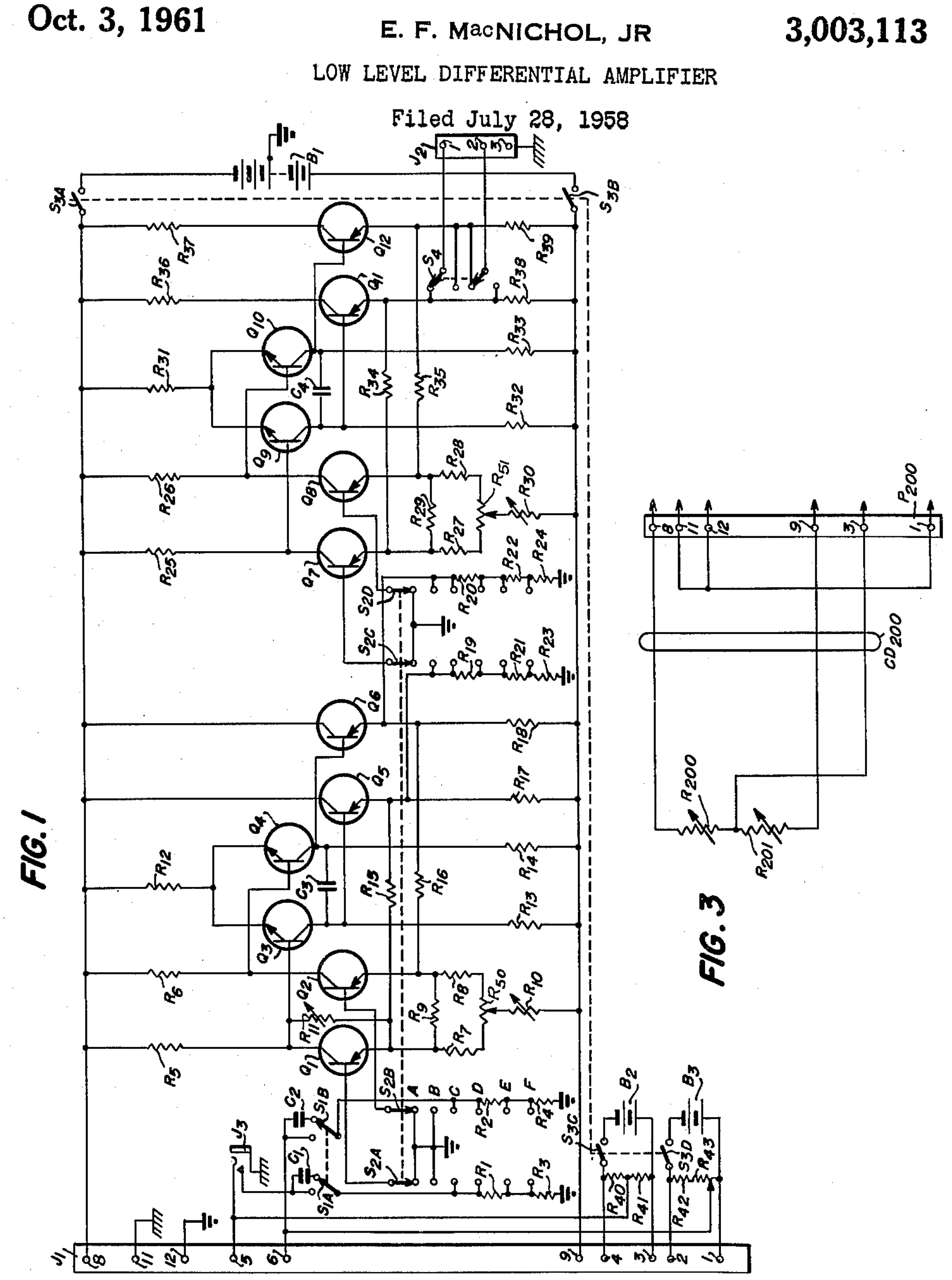
FIG. 1 is a schematic diagram of a differential amplifier incorporating the novel features of this invention.
FIG. 3 is a strain gauge circuit for the improved amplifier of FIG. 1.
Figure 2:
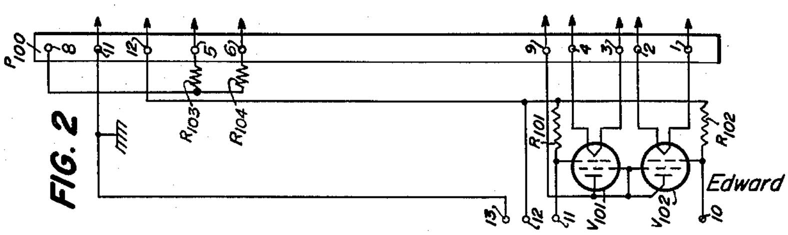
FIG. 2 is a circuit of a cathode following input probe therefor.

Referring now to FIG. 1 of the drawings, there is shown symbolically an input connector jack $J_1$ having numbered terminals 1 to 12. Two of the terminals numbers 5 and 6 are the low level differential input connections for each of the base electrodes, respectively, of a pair of PNP transistors $Q_1$ and $Q_2$. Transistors $Q_1$ and $Q_2$ are preferably types 2N105 and arranged as balanced common emitter amplifiers having collector feeding resistors $R_5$ and $R_6$, of 25K ohms each.

The collector electrodes of $Q_1$ and $Q_2$ connect directly to the base electrodes respectively of NPN transistors $Q_3$ and $Q_4$, preferably of types 2N35. These transistors $Q_3$ and $Q_4$ have collector feed resistors $R_{13}$ and $R_{14}$, and a feed resistor $R_{12}$ of 12K ohms common to both emitters.

In turn, the collector-electrodes of $Q_3$ and $Q_4$ connect directly to the base electrodes, respectively, of PNP transistors $Q_5$ and $Q_6$ preferably types 2N105. These transistors $Q_5$ and $Q_6$ are emitter followers having emitter feed resistors $R_{17}$ and $R_{18}$ of 26K ohms each.

The inter-section (or output) current is delivered from the emitters of these transistors $Q_5$ and $Q_6$ as well as a feed back current through resistors $R_{15}$ and $R_{16}$ of 50K ohms each back to the emitters of the input transistors $Q_1$ and $Q_2$, respectively.

Further feed back is applied by means of emitter-to-emitter resistor $R_9$ of 1K ohms for the pair of transistors $Q_1$ and $Q_2$. Additionally, a balancing network consisting of end resistors $R_7$ and $R_8$ and included variable potentiometer $R_{50}$, having a total resistance of 60K ohms, is placed across resistor $R_9$. The variable tap of this network leads to a combined feed and stage level trimmer resistor $R_{10}$ of 25K ohms.

The following amplifier section is similar to the one just described except for current distribution adjustment to suit the higher level of signal. These changes found desirable are the addition of $R_{36}$ and $R_{37}$ of 1K ohms each in series with the feed to the collectors of followers $Q_{11}$ and $Q_{12}$ and the corresponding reduction to 24K ohms each for their emitter feed resistors $R_{38}$ and $R_{39}$. The purpose of $R_{36}$ and $R_{37}$ is to limit the current through $Q_{11}$ and $Q_{12}$ to a safe value in the event that the output terminals are inadvertently short-circuited to ground. Since they are in series with the already high collector resistances of $Q_{11}$ and $Q_{12}$ their effect upon the output impedance is negligible. It was also found necessary to increase the feedback by reducing emitter-to-emitter resistor $R_{29}$ to 500 ohms. The reason for reducing $R_{29}$ to 500 ohms will now be explained. The feedback network in the first section of the amplifier reduces the gain for signals inserted between the input bases of $Q_1$ and $Q_2$ to very nearly 100 when measured between the emitters of $Q_5$ and $Q_6$. To obtain an overall gain of 10,000 between either output emitter of $Q_{11}$ or $Q_{12}$ and ground, it is necessary to have a gain of 200 between the bases of $Q_7$ and $Q_8$ and the emitters of $Q_{11}$ and $Q_{12}$. Capacitors $C_3$ and $C_4$ were found useful in suppressing oscillation.

A gain programming switch having four sections $S_{2A}$, $S_{2B}$, $S_{2C}$, and $S_{2D}$ is shown divided between the two amplifier sections at each input therefor. On switch position A, the input to both sections is short circuited and grounded, which at position B the input section remains shorted and grounded but the input emitters of $Q_7$ and $Q_8$ are tied to the output emitters of $Q_5$ and $Q_6$. In the position C, the short and ground are removed from the input emitters of the first stage transistors $Q_1$ and $Q_2$ and the signal input connection is made as shown.

The remaining switch positions D, E, and F alternately attenuate the signal between the sections by means of apportioning resistors $R_1$, $R_2$, $R_{19}$, $R_{20}$ of 10K ohms each; $R_{21}$, $R_{22}$ (1K ohms each); $R_3$, $R_4$ (1.11K ohms each) and $R_{23}$, $R_{24}$ (111 ohms each).

By selecting switch positions in order A and then B, the last and then the first amplifier section can be individually balanced and zeroed. Switch position C selects the full gain of $10^4$, D selects $10^3$, E selects $10^2$, and F selects $10^1$ times.

In some cases, it is necessary to match the gain of the pair of transistors. A differential gain compensating resistor $R_{11}$ is shown connected between the emitter and collector electrodes of transistor $Q_1$. This resistor $R_{11}$, when used, is placed on the higher gain transistor of the pair.

A battery B, providing 24 volts center tapped to ground at about 5 milliamperes, is all that is required to power the amplifier. Cells $B_2$ and $B_3$ are provided for filament heating of a pair of electrometer triodes $V_{101}$ and $V_{102}$. These together with high grid resistors $R_{101}$ and $R_{102}$ of 500 megohm each provide a high impedance input probe which may be attached by means of plug $P_{100}$ to the amplifier. Resistors $R_{40}$, $R_{41}$, $R_{42}$ and $R_{43}$ are proportioned so as to cancel out filament potential drop and diode current in tubes $V_{101}$ and $V_{102}$.

The amplifier may be directly attached to a differential strain gauge as shown in FIG. 3, the active elements or wires being $R_{200}$ and $R_{201}$. By means of cord $CD_{200}$ and plug $P_{200}$ this low impedance probe connects to the input jack $J_1$ of the amplifier. It is necessary that $R_{200}$ and $R_{201}$ be so arranged mechanically that differential output is obtained, that is, one element being in compression while the other is in tension.

A test jack $J_3$ is provided attached to the amplifier input for calibration voltage input. A switch $S_{1AB}$ may be used to D.C. isolate the input by means of capacitors $C_1$ and $C_2$. As diagrammed, another switch $S_4$ may be used to reverse the polarity of output to terminal strip $J_2$.

The open loop gain of each section of the amplifier was found to be between 2000 and 6000 depending upon the characteristics of the individual transistors. With feedback as shown, the gain is very nearly 100 per the first section, and 200 for the second as would be expected from elementary feedback amplifier theory. The electrometer probe caused a gain reduction by a factor of 2. Without feedback, the band width is about 10 kc. Feedback increases this to 60 kc. at the 3 db point.

With a 10,000 ohm source, the amplifier is about equal in noise to a good vacuum tube amplifier. With a source of 1000 ohms or less, it is definitely more quiet.

The amplifier is in actual use for physiological work with very gratifying results.

Obviously many other modifications and variations of the present invention are possible in the light of the above teachings. It is, therefore, to be understood that within the scope of the appended claims the invention may be practiced otherwise than as specifically described.

What is claimed is:

1. A differential electronic amplifier device for amplifying a direct or alternating current input signal having a common mode input signal component and a differential mode input signal component, comprising a differential electronic amplifier having two substantially identical sections of three transistors each, each section of transistors having an ungrounded input terminal and a common grounded input terminal, said transistors having elements including emitters, the transistors of each section being directly cascaded connected together for amplifying said direct or alternating current input signal fed between said ungrounded input terminals to said sections of transistors, said differential mode input signal component being applied between said ungrounded input terminals and said common mode input signal component being applied between said ungrounded and grounded input terminals, means for biasing said elements of each section of transistors, the second transistor of each section of three transistors being of complementary conductivity with respect to the first and third transistors of its respective section of transistors to permit the coupling together of the three transistors in its respective section, said third transistor of each section of transistors being arranged in a common collector configuration to provide a more favorable load for said second transistor of each section of transistors, the output signal from one section of transistors being an amplified differential mode input signal component to said differential amplifier and the output signal from the other section of transistors being of equal magnitude and opposite polarity from said amplified differential mode input signal component, each of said output signals from said sections of transistors being faithful reproductions of the differential mode input signal components to said sections of transistors, with the common mode input signal components to said sections of transistors being rejected by said differential amplifier, means including a resistive element for each section of transistors to provide an inverse feedback of a portion of the output signal from the emitter of said third transistor of each section of transistors to the emitter of the first transistor of each section of transistors so as to provide a stable value of gain substantially independently of small changes in the transistors employed in said sections of transistors and of changes in supply voltages as well as increase the band width of said differential electronic amplifier, and means coupled to the input of said amplifier to give a high impedance input thereto and a better signal-to-noise ratio.

2. A differential electronic amplifier device as recited in claim 1, and biasing means positioned between the emitters of the first transistors of each section of transistors and the common point between the input terminals.

3. A differential electronic amplifier device as recited in claim 2, and additionally a second like differential electronic amplifier cascaded coupled to said first mentioned differential electronic amplifier, and additionally means for the input of each amplifier ganged together to apportion the signal between said amplifiers.

4. A differential electronic amplifier device as recited in claim 3, wherein each said last mentioned means includes circuit switching elements for segregating sections of said cascaded electronic amplifiers to facilitate the balancing adjustments thereof.

References Cited in the file of this patent

UNITED STATES PATENTS

| | | |
|---|---|---|
| 2,638,512 | Bessey | May 12, 1953 |
| 2,680,160 | Yaeger | June 1, 1954 |
| 2,789,164 | Stanley | Apr. 16, 1957 |
| 2,801,296 | Blecher | July 30, 1957 |
| 2,828,450 | Pinckaers | Mar. 25, 1958 |
| 2,854,531 | Reijnders | Sept. 30, 1958 |
| 2,863,957 | Hamilton | Dec. 9, 1958 |
| 2,867,695 | Buie | Jan. 6, 1959 |
| 2,873,320 | Gill | Feb. 10, 1959 |
| 2,901,556 | Chapman | Aug. 25, 1959 |
| 2,959,741 | Murray | Nov. 8, 1960 |